US007679403B2

(12) United States Patent
Erstad

(10) Patent No.: US 7,679,403 B2
(45) Date of Patent: Mar. 16, 2010

(54) DUAL REDUNDANT DYNAMIC LOGIC

(75) Inventor: David O. Erstad, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/269,212

(22) Filed: Nov. 8, 2005

(65) Prior Publication Data

US 2007/0103194 A1    May 10, 2007

(51) Int. Cl.
*H03K 19/096* (2006.01)
(52) U.S. Cl. .............................. 326/95; 326/98; 326/9; 326/11; 326/13
(58) Field of Classification Search .................. 326/9, 326/11, 13, 95, 98; 327/55
See application file for complete search history.

(56) References Cited

U.S. PATENT DOCUMENTS

| | | | | |
|---|---|---|---|---|
| 4,851,714 A | * | 7/1989 | Hwang .......................... | 326/98 |
| 6,191,620 B1 | * | 2/2001 | Lattimore et al. .............. | 327/55 |
| 6,292,029 B1 | * | 9/2001 | Kumar et al. .................. | 326/98 |
| 6,753,694 B2 | | 6/2004 | Eaton ........................... | 326/13 |
| 6,756,809 B2 | | 6/2004 | Eaton ........................... | 326/13 |
| 6,791,356 B2 | * | 9/2004 | Haycock et al. ............... | 326/82 |
| 6,794,908 B2 | | 9/2004 | Erstad .......................... | 327/112 |
| 2002/0175713 A1 | | 11/2002 | Knowles ....................... | 326/119 |
| 2006/0026457 A1 | * | 2/2006 | Bernstein et al. ............... | 714/6 |

OTHER PUBLICATIONS

Holman, Tim, "Circuit and Layout Issues," VUSE Radiation Effects and Reliability Group, 2001.
Rao, A., et al., "The Use of Pre-Evaluation Phase in Dynamic CMOS Logic," Proceedings of the IEEE Computer Society Annual Symposium on VLSI, 2005.
Rosing, Richard et al., "Clock Switching: A New Design for Current Test (DcT) Method for Dynamic Logic Circuits," Iddq Test Workshop, San Jose, USA, Nov. 1998.
Vittoz, Eric A., "MOS Transistors Operated in the Lateral Bipolar Mode and their Application in CMOS Technology," IEEE Journal of Solid-State Circuits, vol. SC-18, No. 3, Jun. 1983, pp. 273-279.
Chakrabarty, Krish, "Dynamic Cobmination Circuits," Slides 1-29. www.ee.duke.edu/~Krish/teaching/lectures/dynamic_cmos_2004. pdf, 2004.

* cited by examiner

*Primary Examiner*—Vibol Tan
(74) *Attorney, Agent, or Firm*—Shumaker & Sieffert, P.A.

(57) ABSTRACT

A system and method for hardening dynamic logic against single event upset is described. A precharge circuit is hardened and then connected to two pull down networks. The two pull down networks are redundant and, under normal operating conditions, provide substantially the same outputs when receiving substantially the same inputs. The two outputs are then voted to provide an output that is hardened against single event upset. Alternatively, the two outputs may be connected to a next stage of dynamic logic circuits or other circuitry for evaluation.

18 Claims, 7 Drawing Sheets

DUAL REDUNDANT DYNAMIC LOGIC

FIELD

The present invention relates generally to dynamic logic, and more particularly, relates to hardening dynamic logic against single event upset.

BACKGROUND

Single Event Effects (SEE) are disturbances in an active semiconductor device caused by a single energetic particle. As semiconductor devices become smaller and smaller, transistor threshold voltages decrease. These lower thresholds reduce the charge per node needed to cause errors. As a result, the semiconductor devices become more and more susceptible to transient upsets.

One type of SEE is a single event upset (SEU). SEU is a radiation-induced error in a semiconductor device caused when charged particles lose energy by ionizing the medium through which they pass, leaving behind a wake of electron-hole pairs. The electron-hole pairs form a parasitic conduction path, which can cause a false transition on a node. The false transition, or glitch, can propagate through the semiconductor device and may ultimately result in the disturbance of a node containing state information, such as an output of a latch, register, or gate.

One type of SEU is a single event transient (SET). An SET may occur when a particle strikes a sensitive node within a combinational logic circuit. A voltage disturbance produced at that node may propagate through the logic. As a result of the SET, the combinational logic circuit may provide an erroneous output, which could impact the proper operation of a system that includes the circuit.

Typically, an SEU is caused by ionizing radiation components, such as neutrons, protons, and heavy ions. The ionizing radiation components are abundant in space and at commercial flight altitudes. Additionally, an SEU may be caused by alpha particles from the decay of trace concentrations of uranium and thorium present in some integrated circuit packaging. As another example, an SEU may be caused by detonating nuclear weapons. When a nuclear weapon is detonated, intense fluxes of gamma rays, x-rays, and other high energy particles are created, which may cause SEU.

One circuit family used to implement logic functions is termed dynamic logic. In a typical dynamic logic family, clock signals are used to alternate between two modes of operation. These two modes of operation are called the precharge phase and the evaluation phase. The behavior of these two phases is defined by the use of two transistors and clock signals to control current flow within a dynamic logic gate.

In the precharge phase, the clock signal causes one of the two transistors to be conductive, while the other transistor is non-conductive, which allows current to either enter or depart the output node. Typically, the output node is either charged or discharged to one of the power supplies. If the final state of the output node is the high power supply, then the precharge phase is referred to as a precharge high state. Conversely, the precharge phase is called a precharge low state when the final state of the output node is the low power supply (e.g., ground).

In the evaluation phase, the clock signal switches the two transistors from their respective states in the precharge phase to their respective opposing states (i.e., from a conducting state to a non-conducting state, or vice versa). If the dynamic logic component, based on inputs provided to the dynamic logic component during the evaluation phase, permits current flow during the evaluation phase, then the output of the dynamic logic circuit changes from the precharge high or low state to the opposing state. If the dynamic logic component, based on inputs provided to it during the evaluation phase, does not permit current flow, then the output of the dynamic logic circuit does not change from the precharge high or low state.

Since dynamic logic retains the precharge state unless the dynamic logic component is enabled to conduct current during the evaluation phase, dynamic logic offers several advantages. Compared to static logic designs, dynamic logic requires nearly half as many components to implement a given logic function and can offer considerably faster switching speeds. Thus, the benefits of dynamic logic are particularly important to high speed computing, telecommunications, and information networks.

Dynamic logic is also valuable to military and space-based applications, but circuits in such environments may be at risk of SEUs. An SEU can occur in the precharge circuitry or the evaluation circuitry. An SEU in the precharge and/or evaluation circuits may be sufficient to cause an erroneous result in a circuit using dynamic logic.

Therefore, it would be beneficial to harden dynamic logic circuits against SEU.

SUMMARY

A system and method for hardening dynamic logic against SEU is described. A dual redundant logic circuit includes a precharge circuit that is hardened against SEU, a first pull down network connected to the precharge circuit, and a second pull down network connected to the precharge circuit. The first pull down network controls a first output of the dual redundant logic circuit and the second pull down network controls a second output of the dual redundant logic circuit.

In one example, the precharge circuit includes a transistor connected to a current limiting impedance. In another example, the precharge circuit includes two transistors, in which a first and a second transistor are connected in series to form a transistor pair. In yet another example, the precharge circuit includes three transistors, in which a first transistor is connected in series with a second and third transistor. The second transistor and the third transistor are used to precharge two outputs. In yet another example, the precharge circuit includes four transistors, in which a first and second transistor are connected in series to form a first transistor pair, a third and fourth transistor are connected in series to form a second transistor pair, and the first and second transistor pairs are used to precharge two outputs. Note that any of the above precharge structures may be replicated as needed to provide a plurality of precharge signals.

The first pull down network operates substantially the same as the second pull down network. The first pull down network and the second pull down network include a logic circuit. The first pull down network is connected to a first output node and the second pull down network is connected to a second output node. The first pull down network is connected in series with the second pull down network, and the first pull down network controls a first output node and the second pull down network controls a second output node.

The dual redundant logic circuit may also include a voter to compare the first output with the second output and provide an output of the dual redundant logic circuit that is hardened against SEU. The voter may be an OR gate, a NOR gate, an AND gate, a NAND gate, or any other appropriate circuitry. Alternatively, the first and second outputs of the dual redundant logic circuit may be connected to a next circuit stage for evaluation.

A method for hardening a dynamic logic circuit is also described. The method includes hardening a precharge circuit of the dynamic logic circuit and providing a redundant pull down network. The hardening of the precharge circuit may be accomplished by adding a current limiting impedance to the precharge circuit. Alternatively, the hardening of the precharge circuit may be accomplished by adding at least one additional transistor to the precharge circuit.

The redundant pull down network may be provided by connecting a first pull down network in series with a second pull down network. The first pull down network controls a first output node and the second pull down network controls a second output node. The second pull down network may be redundant to the first pull down network and, under normal operating conditions, provide substantially the same output as the first pull down network when receiving substantially the same inputs.

The method may also include connecting a first and a second output of the dynamic logic circuit to a next stage for evaluation. Alternatively, the method may also include comparing a first and a second output of the dynamic logic circuit. The comparison may be used to provide an output of the dual redundant logic circuit that is hardened against SEU.

Hardening dynamic logic against SEU allows this type of logic to be used in extreme conditions. Triple redundancy is sometimes used to harden dynamic logic. By hardening the precharge circuit in a dynamic logic circuit, dual redundancy may be used, which reduces the overhead needed to harden dynamic logic.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
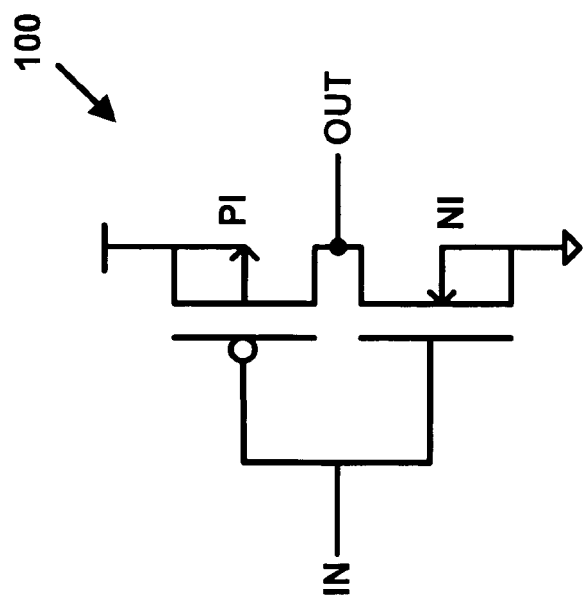
FIG. 1 is a circuit diagram of a logic circuit.

FIG. 1 is a circuit diagram of a typical non-hardened CMOS inverter 100. The inverter 100 includes two transistors P1 and N1; an input IN; and an output OUT. If IN is at a logic-0 level, then P1 is on, N1 is off, and OUT is at a logic-1 level. A particle strike on N1 may disturb the OUT voltage state because the created charge in N1 may result in a pull-down current competing against the pull-up current of P1. If the pull-down current is sufficiently larger than the pull-up current, the OUT voltage may temporarily fall below the switch point of a subsequent logic gate. As a result, an SEU induced state change pulse may be propagated. A particle strike on P1 does not disturb the OUT voltage state because there are no voltage differences within P1 to cause charge movement towards OUT. Thus, none of the created charge is removed. When IN is at a logic-1 level, the charge collection mechanism as described above switches between the P1 and N1 transistors.

Figure 2:
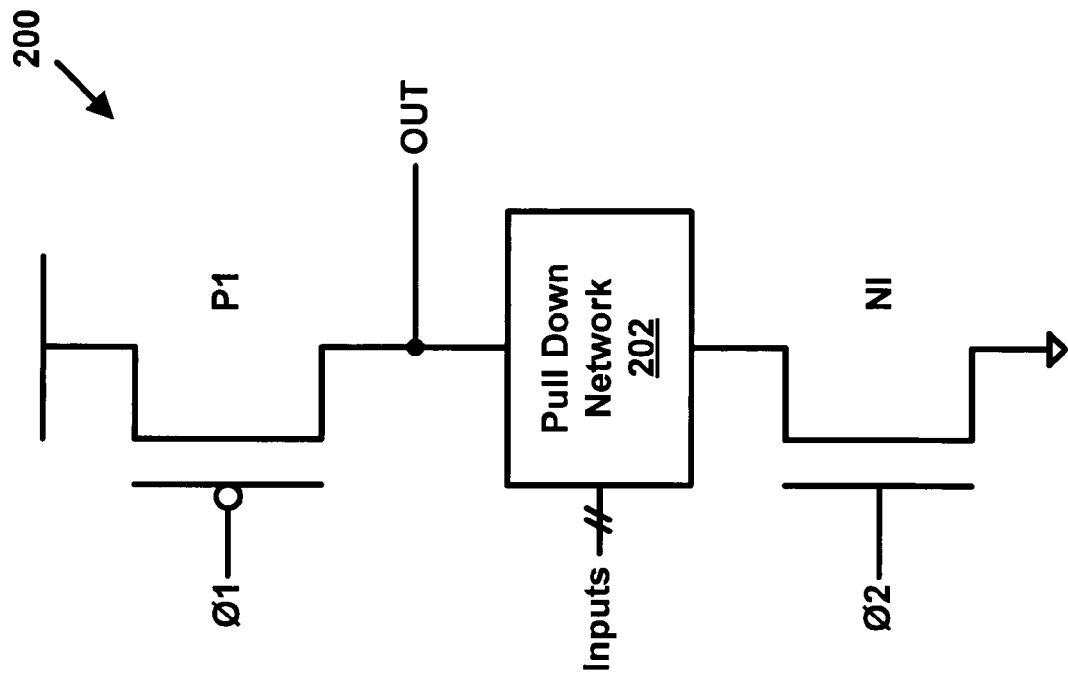
FIG. 2 is a circuit diagram of a dynamic logic circuit.

FIG. 2 is a circuit diagram of a typical dynamic logic circuit 200. The dynamic logic circuit 200 includes two transistors P1 and N1, and a pull down network 202. The pull down network 202 is connected between the two transistors P1 and N1. Inputs to the dynamic logic circuit 200 are connected to the pull down network 202. An output OUT of the dynamic logic circuit 200 is connected to the drain of the P1 transistor and the pull down network 202. Clock inputs Ø1 and Ø2 are connected to the gates of the P1 and N1 transistors, respectively.

The dynamic logic circuit 200 operates in two states. These states are typically referred to as the precharge phase and the evaluation phase. The precharge phase of the dynamic logic circuit 200 occurs when the clock inputs Ø1 and Ø2 are both at a logic-0 level. The evaluation phase of the dynamic logic circuit 200 occurs when the clock inputs Ø1 and Ø2 are both at a logic-1 level.

The dynamic logic circuit 200 depicted in FIG. 2 may be referred to as a precharge high design because at the end of the precharge phase, the output of the dynamic logic circuit 200 is at a logic-1 level. A dynamic logic circuit can also operate with the opposite behavior by switching P1 with N1 and vice versa. This type of dynamic logic circuit is referred to as a precharge low design. Regardless of whether the dynamic logic circuit 200 is a precharge high or low design, the clock inputs Ø1 and Ø2 are typically connected to the same clock signal source, but this common practice is not a necessary requirement for implementing dynamic logic circuits.

When the dynamic logic circuit 200 is in the precharge phase, P1 is on and N1 is off. If OUT is at a logic-0 level, current flows from the source of P1 to the drain of P1 until OUT is at a logic-1 level. If OUT is already at a logic-1 level, then OUT remains at a logic-1 level. Thus, at the end of the precharge phase, OUT is at a logic-1 level. This final output state of the precharge phase explains why the dynamic logic circuit of FIG. 2 may be referred to as a precharge high design. In addition, since the P1 transistor is the active transistor during the precharge phase, the P1 transistor may be referred to as the "precharge circuit."

When the dynamic logic circuit 200 is in the evaluation phase, N1 is on and P1 is off. With OUT at a logic-1 level due to the prior precharge phase and N1 on, OUT either remains at a logic-1 level or declines towards ground, depending on the state of the pull down network 202. The pull down network 202 may be any logic circuit or combination of logic circuits. For example, two N-channel devices in series may be used to implement a NAND function.

If the pull down network 202 does not allow current flow, then OUT remains at a logic-1 level. If the pull down network 202 does allow current flow, then OUT declines towards ground. Generally, the evaluation phase is complete when OUT is at a logic-0 level. However, it is possible that the pull down network 202 may not be designed to reach that state within the time allotted by the evaluation phase.

A particle strike may disrupt the performance of the dynamic logic circuit 200. For example, during the precharge phase an SEU in N1 may cause a pull-down current exceeding the pull-up current provided by P1. This type of SEU may result in OUT being at a lower voltage level than designed when entering the evaluation phase. If OUT is at a lower voltage level than designed when entering the evaluation phase, the output of the dynamic logic circuit 200 may induce errors that propagate through subsequent stages of dynamic logic circuits or other circuits connected to the dynamic logic circuit 200.

As another example, during the evaluation phase, an SEU in P1 may cause a pull-up current provided by P1 that exceeds the pull-down current through the pull down network 202 and N1. Or, if the pull down network 202 is inactive during the evaluation phase, an SEU in the pull down network 202 may induce an undesired pull-down current through the pull down network 202 that is contrary to the input signals provided to the pull down network 202. In either of these two situations, the voltage of OUT may degrade below the designed signal level during the evaluation phase. If OUT is at a lower voltage level than designed at the conclusion of the evaluation phase, the dynamic logic circuit 200 may induce errors that propagate through subsequent stages of dynamic logic circuits or other circuits connected to the dynamic logic circuit 200.

Figure 3:
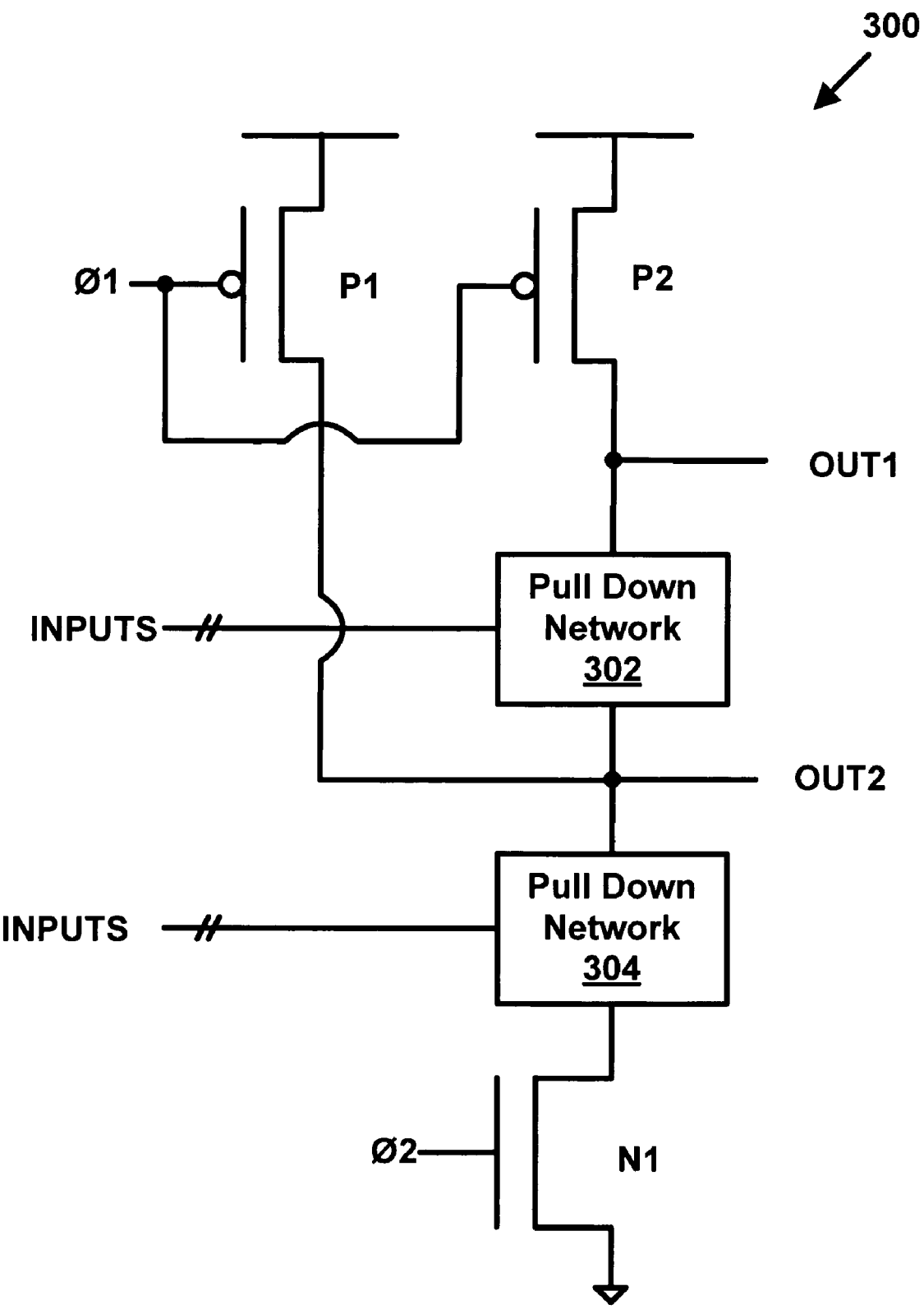
FIG. 3 is a circuit diagram of a multi-output dynamic logic circuit.

FIG. 3 is a circuit diagram of a multi-output dynamic logic circuit 300. The dynamic logic circuit 300 includes three transistors P1, P2, and N1; and two pull down networks 302, 304. Clock input Ø1 is connected to the gates of the P1 and P2 transistors, and clock input Ø2 is connected to the gate of the N1 transistor. The first pull down network 302 is connected to the drains of the P1 and P2 transistors, and the second pull down network 304. The second pull down network 304 is connected to the drains of the P1 and N1 transistors, and the first pull down network 302. Inputs to the dynamic logic circuit 300 are also connected to the pull down networks 302, 304. The pull down networks 302, 304 may receive the same or different inputs.

The dynamic logic circuit 300 depicted in FIG. 3 has two outputs, OUT1 and OUT2. OUT1 is connected to the drain of the P2 transistor and OUT2 is connected to the drain of the P1 transistor. While the dynamic logic circuit 300 depicted in FIG. 3 has two outputs, it is understood that the dynamic logic circuit 300 may be expanded to include as many outputs as needed for a particular circuit design.

During the precharge phase, OUT1 and OUT2 are at a logic-1 level. When the dynamic logic circuit 300 enters the evaluation phase, P1 is off, P2 is off, and N1 is on. Depending on their respective input signals, the pull down networks 302, 304 may or may not allow current flow. If the second pull down network 304 is off, then regardless of the configuration of the first pull down network 302, both OUT1 and OUT2 remain at a logic-1 level. If the second pull down network 304 is on and the first pull down network 302 is off, then OUT1 may remain at a logic-1 level, while OUT2 declines to at a logic-0 level. If the first pull down network 302 and the second pull down network 304 are on, then OUT1 may decline toward OUT2's state and OUT2 may decline towards ground. Normally, the evaluation phase may be long enough so that values of OUT1 and OUT2 are at either a logic-0 level or at a logic-1 level; however, this is not a necessary condition.

A particle strike may disrupt the performance of the dynamic logic circuit 300. For example, during the precharge phase an SEU in N1 may cause a pull-down current exceeding the pull-up current provided by P1. This type of SEU may result in OUT1 or OUT2 being at a lower voltage level than designed when entering the evaluation phase. If OUT1 or OUT2 is at a lower voltage level than designed when entering the evaluation phase, the dynamic logic circuit 300 may induce errors that propagate through subsequent stages of dynamic logic circuits or other circuits connected to the dynamic logic circuit 300.

As another example, during the evaluation phase an SEU in P1 may cause a pull-up current that exceeds the pull-down current through the second pull down network 304 and N1. Similarly, during the evaluation phase an SEU in P2 may cause a pull-up current that exceeds the pull-down current through the first pull down network 302, the second pull down network 304, and N1. Alternatively, if either of the pull down networks 302, 304 is inactive during the evaluation phase, an SEU in the first pull down network 302 or the second pull down network 304 may induce an undesired pull-down current. In either of these two situations, the voltage of OUT1 or OUT2 may degrade below the designed signal levels during the evaluation phase. If OUT1 or OUT2 is at a lower voltage level than designed at the conclusion of the evaluation phase, the dynamic logic circuit 300 may induce errors that propagate through subsequent stages of dynamic logic circuits or other circuits connected to the dynamic logic circuit 300.

FIGS. 4A-4D are circuit diagrams for a hardened precharge circuit. In these examples, the precharge circuit replaces the P1 transistor depicted in FIG. 2; however, the hardening techniques may be expanded to the precharge circuits in multi-output dynamic logic designs, such as the multi-output dynamic logic circuit 300 depicted in FIG. 3. By hardening the precharge circuit, a dynamic logic circuit may be hardened using dual redundancy as described with respect to FIGS. 5, 6, and 7.

Figure 4C:
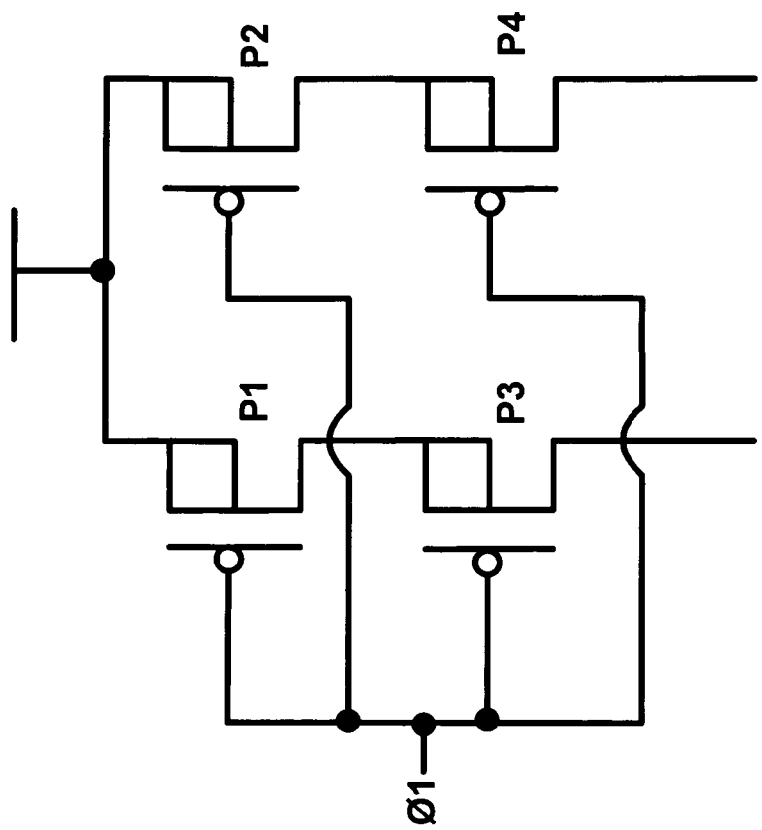
FIG. 4 a circuit diagram of a hardened precharge, according to an example.
Figure 4B:
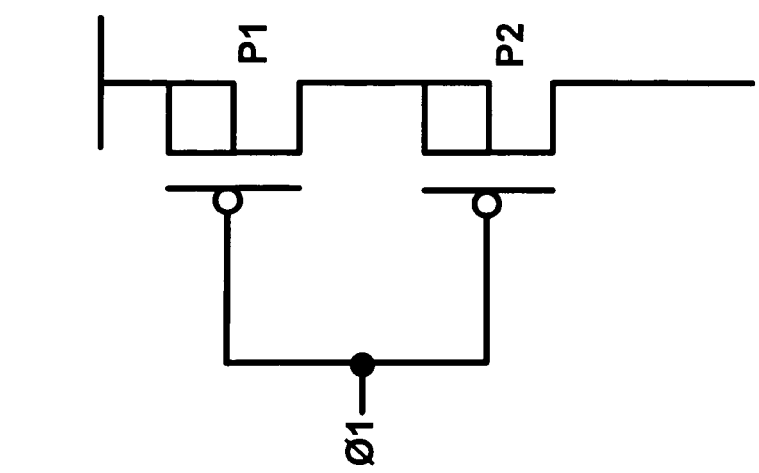
Figure 4A:
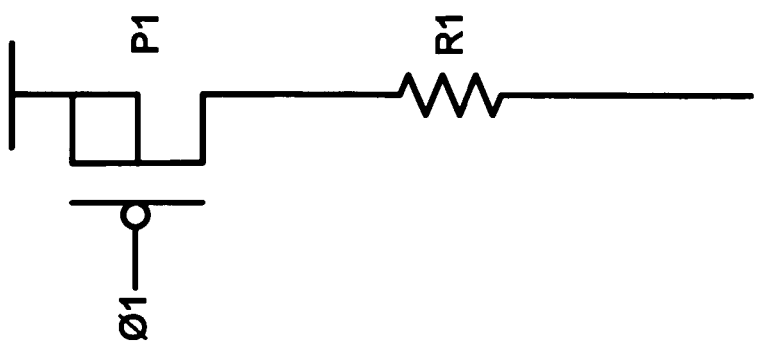

FIG. 4A is a circuit diagram for a hardened precharge circuit according to an example. In this example, a resistor R1 is connected between the drain of the P1 transistor and a pull down network, such as the pull down network 202 depicted in FIG. 2. The resistor R1 is a current limiting resistor. Alternatively, the resistor R1 may be any impedance device that can limit current. R1 may be sized according to the requirements of the circuit. If R1 is sufficiently large, the precharge circuit P1 may be hardened against SEU.

FIG. 4B is a circuit diagram for a hardened precharge circuit according to another example. In this example, one additional p-type transistor P2 is added to the precharge circuit P1. P1 and P2 are connected in series. The gates of the P1 and P2 transistors are connected to the clock input Ø1. A particle strike on one of the transistors P1 and P2 does not impact the output of the dynamic logic circuit.

FIG. 4C is a circuit diagram for a hardened precharge circuit according to another example. In this example, three additional p-type transistors P2, P3, P4 are added to the precharge circuit P1. P1 and P3 are connected in series to form a first transistor pair, while P2 and P4 are connected in series to form a second transistor pair. The first and second transistor pairs are used to precharge two outputs. The gates of all four transistors are connected to the clock input Ø1. A particle strike on any one of the four transistors does not impact the output of the dynamic logic circuit.

Figure 4D:
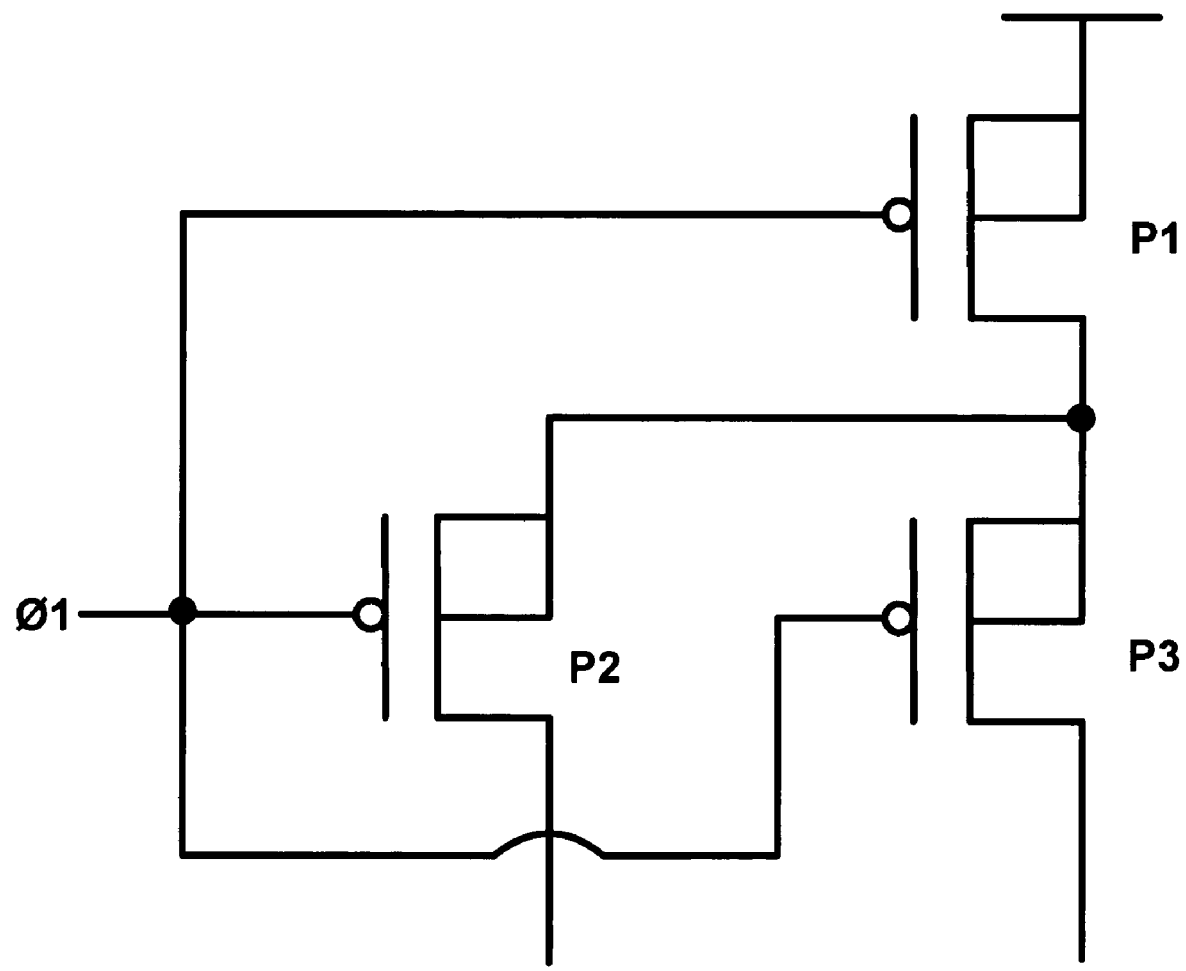

FIG. 4D is a circuit diagram for a hardened precharge circuit according to yet another example. In this example, two transistors P2 and P3 are added to the precharge circuit P1. The two transistors P2 and P3 are connected in parallel. P1 is connected in series with each of the other two transistors P2, P3. The second transistor P2 and the third transistor P3 are used to precharge two outputs. The gates of all three transistors are connected to the clock input Ø1. When the transistors P1-P3 are off, a particle strike on P1, P2 or P3 will not impact the output of the dynamic logic circuit.

While FIG. 4D depicts two additional transistors connected in series with the precharge circuit P1, it is understood that a plurality of additional transistors may be connected in series with the precharge circuit P1. The plurality of additional transistors may be used to precharge a plurality of outputs.

While FIGS. 4A-D depict hardened precharge circuits using PMOS transistors, it is understood that hardened precharge circuits may be created using NMOS structures as well. Additionally, while four examples have been provided for hardening the precharge circuit, it is understood that any hardening technique now known or developed in the future may be used to harden the precharge circuit. By hardening the precharge circuit, dual redundancy may be used to harden a dynamic logic circuit due to the unidirectional nature of the remaining hit concerns. As a result, less overhead is required to harden the dynamic logic circuit than triple modular redundancy, which is sometimes used to harden logic.

Figure 5:
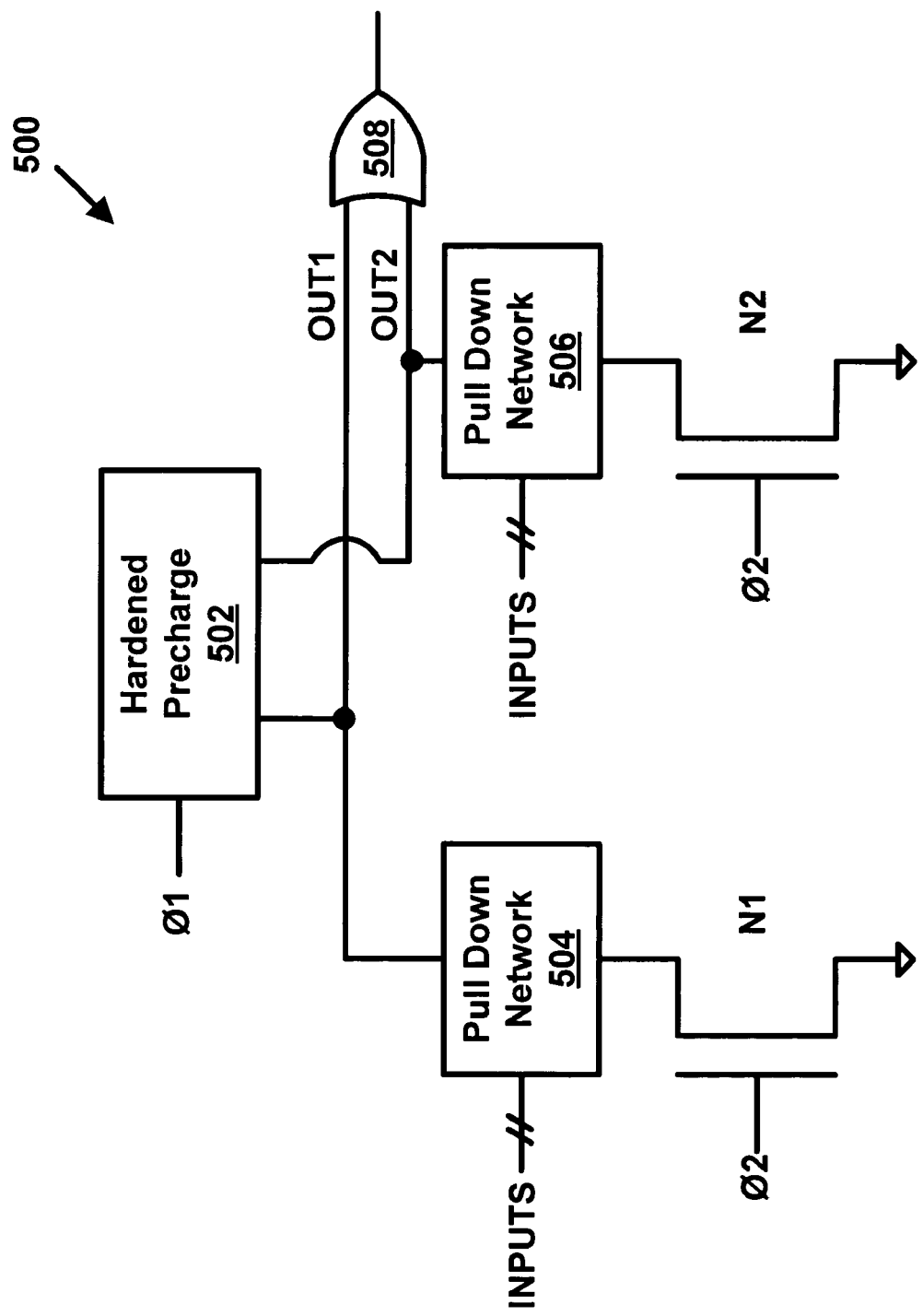
FIG. 5 is a circuit diagram of a dual redundant dynamic logic circuit, according to an example.

FIG. 5 is a circuit diagram of a dual redundant dynamic logic circuit 500. The dual redundant dynamic logic circuit 500 includes a hardened precharge circuit 502. The hardened precharge circuit 502 is a precharge circuit that has been hardened against the effects of SEU. For example, the hardened precharge circuit 502 may include any of the circuits depicted in FIG. 4. Other hardened precharge circuits may also be used. A clock input Ø1 is connected to the hardened precharge circuit 502.

The hardened precharge circuit 502 is connected to two pull down networks 504, 506. The pull down network 504 is connected to a transistor N1, while the pull down network 506 is connected to a transistor N2. A clock input Ø2 is connected to the gates of the transistors N1, N2. The clock inputs Ø1 and Ø2 may or may not be connected to the same clock signal source.

The pull down networks 504, 506 may be any logic circuit or combination of logic circuits. For example, two N-channel devices connected in series may be used to implement a NAND function. The two pull down networks 504, 506 are redundant, meaning that the two outputs OUT1 and OUT2, which are based on the state of the clock inputs Ø1 and Ø2 and the state of the pull down networks 504, 506, are designed to be the same during normal operating conditions. Typically, the pull down networks 504, 506 have the same circuit design. However, this is not necessary as long as the same inputs result in the same outputs during normal operating conditions.

The two outputs OUT1 and OUT2 are connected to inputs of an OR gate 508. The OR gate 508 acts as a voter, providing an output of the dynamic logic circuit 500 that has been hardened against SEU. Other voter designs may also be implemented. For example, a NOR gate, an AND gate, and a NAND gate may also be used in voter designs. Alternatively, the two outputs OUT1 and OUT2 may be connected to a next stage of dynamic logic circuits or other circuitry, and be evaluated at that point.

Figure 6:
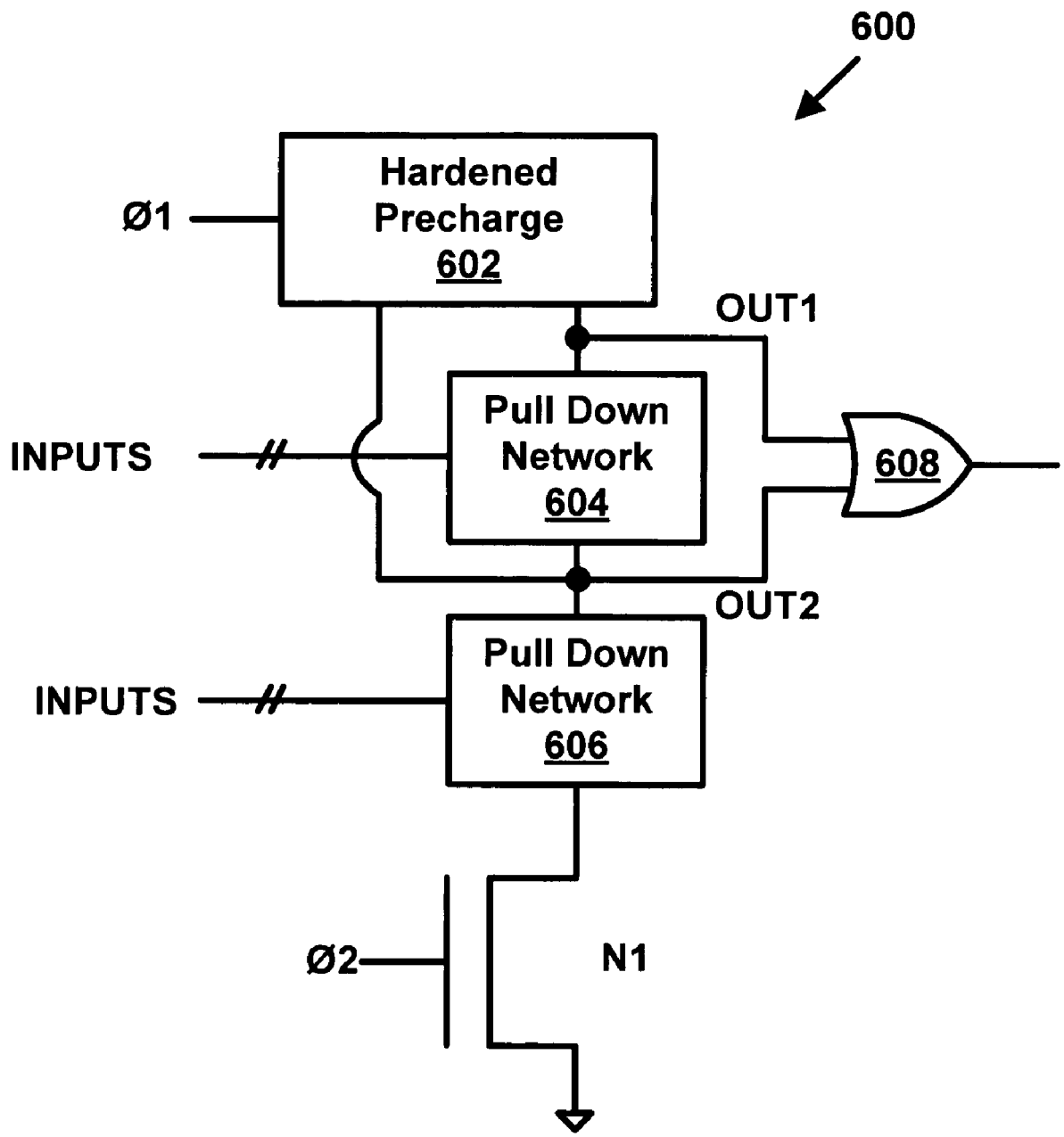
FIG. 6 is a circuit diagram of a dual redundant dynamic logic circuit, according to another example.

FIG. 6 is a circuit diagram of a dual redundant dynamic logic circuit 600 according to another example. In this example, one less transistor is needed, further reducing design overhead. The hardened precharge 602 is substantially the same as the hardened precharge 502 depicted in FIG. 5. Additionally, the pull down networks 604, 606 are substantially the same as the pull down networks 504, 506 depicted in FIG. 5. Likewise, the OR gate 608 is substantially the same as the OR gate 508 depicted in FIG. 5.

By connecting the pull down networks 604, 606 in series, only one transistor N1 is needed between the pull down networks 604, 606 and ground. Like the dual redundant dynamic logic circuit 500 depicted in FIG. 5, the outputs OUT1 and OUT2 can be voted using the OR gate 608 or any other suitable voting mechanism. The OR gate 608 provides an output of the dynamic logic circuit 600 that is hardened against SEU. Alternatively, the two outputs OUT1 and OUT2 may be connected to a next stage of dynamic logic circuits or other circuitry, and be evaluated at that point.

Figure 7:
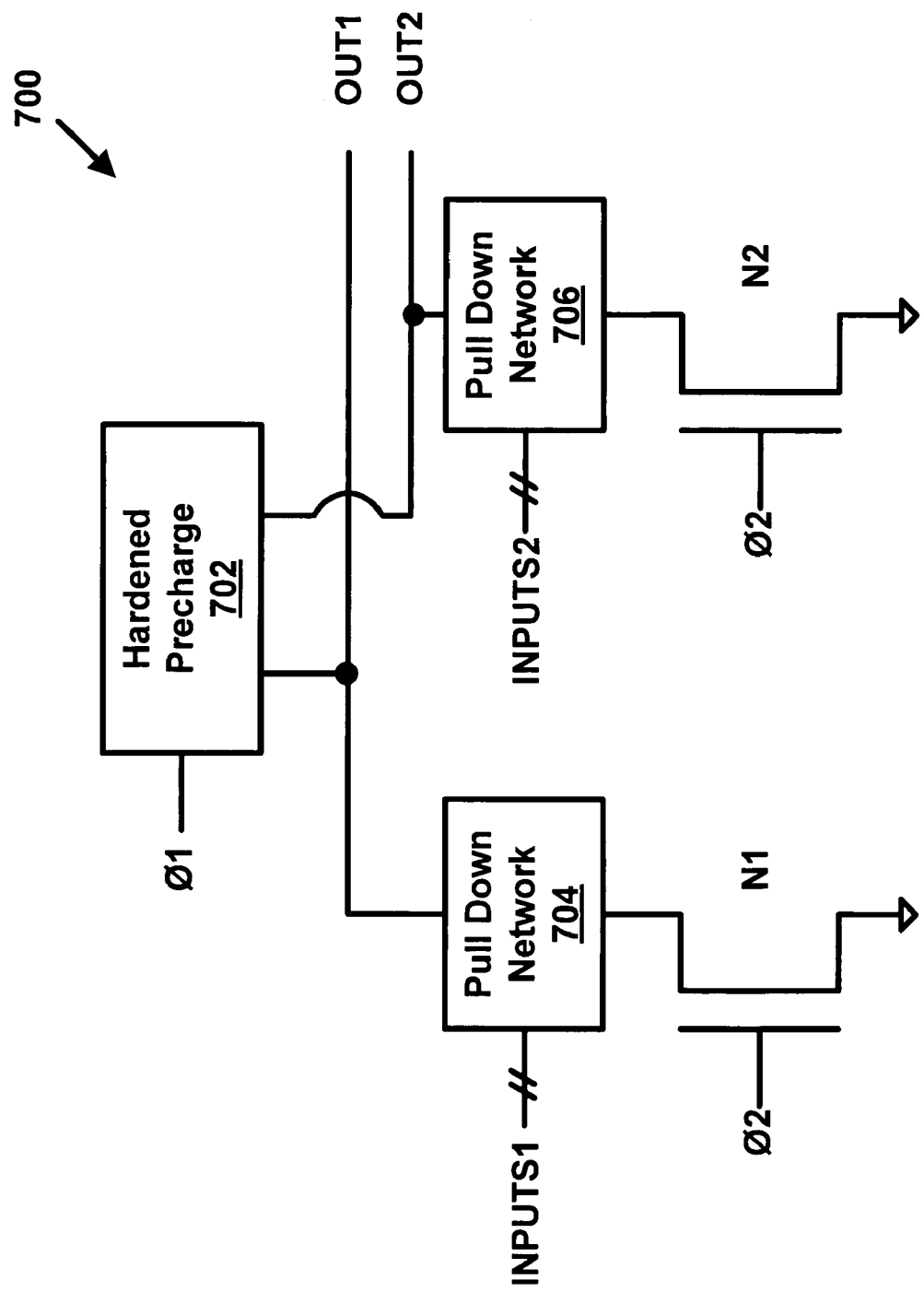
FIG. 7 is a circuit diagram of a dual redundant dynamic logic circuit, according to yet another example.

FIG. 7 is a circuit diagram of a dual redundant dynamic logic circuit 700 according to yet another example. The dual redundant dynamic logic circuit 700 is similar to the dual redundant dynamic logic circuit 500 depicted in FIG. 5. However, the dual redundant dynamic logic circuit 700 receives two sets of inputs, INPUTS1 and INPUTS2 and does not include a voter, such as the OR gate 508 depicted in FIG. 5. In this example, the INPUTS1 are connected to a first set of outputs from other dynamic logic gates (i.e., OUTPUTS1) and the INPUTS2 are connected to a second set of outputs from other dynamic logic gates (i.e., OUTPUTS2). In this manner, dual outputs drive a next stage of dynamic logic circuits, which may be used to evaluate whether an SEU has occurred.

It should be understood that the illustrated embodiments are examples only and should not be taken as limiting the scope of the present invention. For example, while the examples provided herein depict CMOS transistors, other transistor types may also be used. Additionally, while the examples depict precharge high designs, precharge low designs also benefit from the teachings herein. Moreover, other hardening techniques for the precharge and other voting techniques for the outputs of the dual dynamic logic circuits may also be used. The claims should not be read as limited to the described order or elements unless stated to that effect. Therefore, all embodiments that come within the scope and spirit of the following claims and equivalents thereto are claimed as the invention.

I claim:

1. A dual redundant logic circuit comprising:
   a precharge circuit that is hardened against single event upset, wherein the precharge circuit comprises four transistors, wherein a first transistor and a second transistor are connected in series to form a first transistor pair, wherein a third transistor and a fourth transistor are connected in series to form a second transistor pair, and wherein the first and second transistor pairs are used to precharge a first output and a second output;
   a first pull down network connected to the precharge circuit, wherein the first pull down network receives a first set of inputs and controls the first output of the dual redundant logic circuit; and
   a second pull down network connected to the precharge circuit, wherein the second pull down network receives a second set of inputs substantially the same as the first set of inputs and controls the second output of the dual redundant logic circuit.

2. The circuit of claim 1, wherein the first pull down network operates substantially the same as the second pull down network.

3. The circuit of claim 1, wherein the first and second pull down networks include a logic circuit.

4. The circuit of claim 1, wherein the first pull down network is connected to a first output node and the second pull down network is connected to a second output node.

5. The circuit of claim 1, further comprising a voter to compare the first output with the second output and provide an output that is hardened against single event upset.

6. The circuit of claim 5, wherein the voter is selected from the group of devices consisting of an OR gate, a NOR gate, an AND gate, a NAND gate, and logically equivalent constructs of the OR gate, the NOR gate, the AND gate, and the NAND gate.

7. The circuit of claim 1, wherein the first and second outputs of the dual redundant logic circuit are connected to a subsequent circuit for evaluation.

8. A dual redundant logic circuit comprising:
a precharge circuit that is hardened against single event upset, wherein the precharge circuit comprises:
a first transistor;
a first precharge node;
a second transistor connected in series with the first transistor between the first transistor and the first precharge node;
a second precharge node; and
a third transistor connected in series with the first transistor between the first transistor and the second precharge node, wherein gates of the first, second, and third transistors are connected to a clock input;
a first pull down network connected to the precharge circuit, wherein the first pull down network receives a first set of inputs and controls the first precharge node of the dual redundant logic circuit; and
a second pull down network connected to the precharge circuit, wherein the second pull down network receives a second set of inputs substantially the same as the first set of inputs and controls the second precharge node of the dual redundant logic circuit.

9. The dual redundant logic circuit of claim 8, wherein the precharge circuit further comprises:
a plurality of additional transistors connected in series with the first transistor to provide a plurality of precharge nodes, wherein gates of the first transistor and the plurality of additional transistors are connected to the clock input.

10. A method for hardening a dynamic logic circuit comprising:
hardening a precharge circuit of the dynamic logic circuit, such that the precharge circuit comprises four transistors, wherein a first transistor and a second transistor are connected in series to form a first transistor pair, wherein a third transistor and a fourth transistor are connected in series to form a second transistor pair, and wherein the first and second transistor pairs are used to precharge a first output and a second output of the dynamic logic circuit; and
providing a redundant pull down network, wherein providing a redundant pull down network includes connecting a first pull down network to the precharge circuit and a second pull down network to the precharge circuit, wherein the first pull down network controls the first output and the second pull down network controls the second output.

11. The method of claim 10, further comprising connecting the first and the second output of the dynamic logic circuit to a subsequent circuit for evaluation.

12. The method of claim 10, further comprising comparing the first and the second output of the dynamic logic circuit.

13. The method of claim 12, further comprising providing a third output that is hardened against single event upset based on the comparison of the first and the second outputs.

14. A method for hardening a dynamic logic circuit comprising:
hardening a precharge circuit of the dynamic logic circuit, such that the precharge circuit comprises:
a first transistor;
a first precharge node;
a second transistor connected in series with the first transistor between the first transistor and the first precharge node;
a second precharge node; and
a third transistor connected in series with the first transistor between the first transistor and the second precharge node, wherein gates of the first, second, and third transistors are connected to a clock input; and
providing a redundant pull down network, wherein providing a redundant pull down network includes connecting a first pull down network to the precharge circuit and a second pull down network to the precharge circuit, wherein the first pull down network controls the first precharge node and the second pull down network controls the second precharge node.

15. The circuit of claim 8, wherein the first pull down network operates substantially the same as the second pull down network.

16. The circuit of claim 8, wherein the first and second pull down networks include a logic circuit.

17. The circuit of claim 8, further comprising a voter to compare the first output with the second output and provide an output that is hardened against single event upset.

18. The circuit of claim 17, wherein the voter is selected from the group of devices consisting of an OR gate, a NOR gate, an AND gate, a NAND gate, and logically equivalent constructs of the OR gate, the NOR gate, the AND gate, and the NAND gate.

* * * * *